United States Patent
Abdul Razak

(10) Patent No.: US 8,704,371 B2
(45) Date of Patent: Apr. 22, 2014

(54) SEMICONDUCTOR DEVICE HAVING MULTIPLE BUMP HEIGHTS AND MULTIPLE BUMP DIAMETERS

(75) Inventor: Ramlah Binte Abdul Razak, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/543,907

(22) Filed: Jul. 9, 2012

(65) Prior Publication Data

US 2013/0087910 A1    Apr. 11, 2013

Related U.S. Application Data

(63) Continuation-in-part of application No. 13/269,938, filed on Oct. 10, 2011.

(51) Int. Cl.
*H01L 23/498* (2006.01)

(52) U.S. Cl.
USPC ............... 257/738; 257/737; 257/E23.068

(58) Field of Classification Search
CPC ........... H01L 2224/05552; H01L 2224/05571; H01L 2224/131; H01L 2924/00012; H01L 2924/00013; H01L 2924/014; H01L 24/81; H01L 23/498
USPC .................... 257/737, 738, E23.068
See application file for complete search history.

(56) References Cited

U.S. PATENT DOCUMENTS

| 7,569,471 | B2 | 8/2009 | Pang et al. |
| 2007/0069346 | A1 | 3/2007 | Lin et al. |
| 2007/0184578 | A1* | 8/2007 | Lin et al. ............... 438/106 |
| 2008/0018423 | A1* | 1/2008 | Matsui et al. ......... 335/126 |
| 2008/0081458 | A1* | 4/2008 | Lin et al. ............... 438/620 |
| 2008/0182120 | A1 | 7/2008 | Tan et al. |
| 2009/0266972 | A1* | 10/2009 | Goldmann ............ 249/119 |
| 2010/0044872 | A1 | 2/2010 | Park et al. |

FOREIGN PATENT DOCUMENTS

JP    6188286    7/1994

\* cited by examiner

*Primary Examiner* — Kimberly Rizkallah
*Assistant Examiner* — Duy T Nguyen
(74) *Attorney, Agent, or Firm* — Steven A. Shaw; Wade James Brady, III; Frederick J. Telecky, Jr.

(57) ABSTRACT

A semiconductor die includes a first contact stack including a first UBM pad on a first die pad, a second contact stack including a second UBM pad on a second die pad, and a third contact stack including a third UBM pad on a third die pad. The second UBM pad perimeter is shorter than the first UBM pad perimeter, and the third UBM pad perimeter is longer than the second UBM pad perimeter. A first solder bump is on the first UBM pad, a second solder bump is on the second UBM pad, and a third solder bump is on the third UBM pad. The first solder bump, second solder bump and third solder bump all have different sizes.

9 Claims, 6 Drawing Sheets

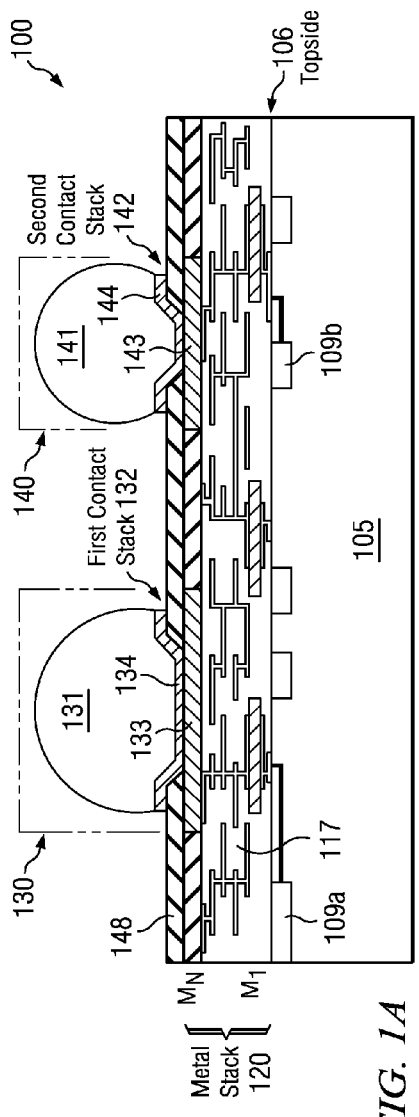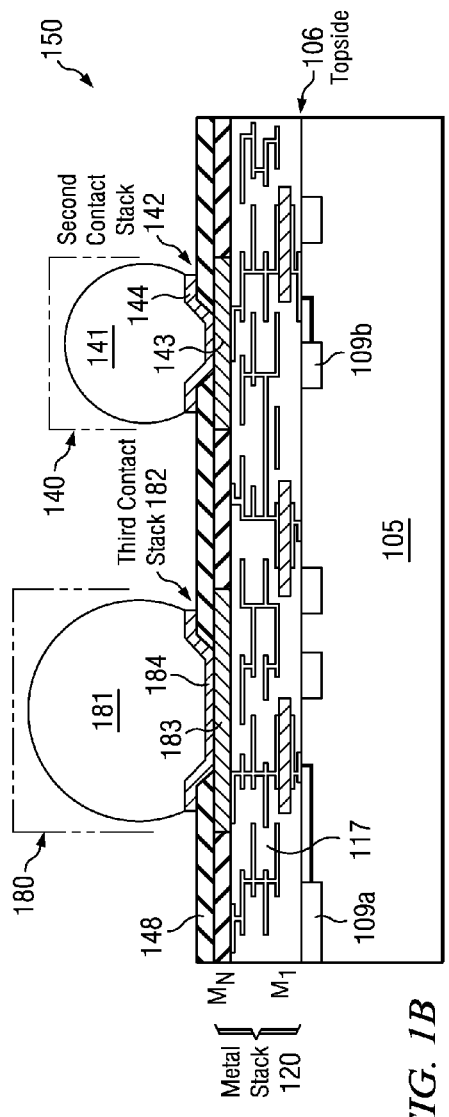

_US 8,704,371 B2_

SEMICONDUCTOR DEVICE HAVING MULTIPLE BUMP HEIGHTS AND MULTIPLE BUMP DIAMETERS

CROSS REFERENCE TO RELATED APPLICATIONS

This application is a continuation-in-part (CIP) of patent application Ser. No. 13/269,938 entitled "SEMICONDUCTOR DEVICE HAVING IMPROVED CONTACT STRUCTURE" filed Oct. 10, 2011, which is herein incorporated by reference in its entirety.

FIELD

Disclosed embodiments relate to semiconductor integrated circuit (IC) die having different solder bump sizes.

BACKGROUND

Conventional semiconductor IC die utilize metal die pads for receiving and supplying signals to and from other circuitry. The die pad is usually in a rectangular shape, wherein some of the metal layers are utilized for carrying signals between the die pads and other circuitry of the IC chip. Conductive lines formed from one or more of the metal layers connect the die pads to nodes in the circuitry.

One method of die assembly utilizes solder bumped die that are flip chip assembled onto a workpiece. Flip chip interconnections provide short electrical connecting paths as compared to wire bonds, and therefore better electrical performance including speed. Conventional semiconductor die for flip chip applications have a single bump size including a single bump height and a single bump diameter that that are formed over die pads of a single fixed size.

The flip-chip die size in many IC design is limited by the size of the solder pads and the pad pitch, the number of input/output (I/O) pins, and the current density limitation of each solder pad. Uniform die pad size of the minimum pitch often necessitates multiple die pads for each high current (e.g., power supply terminal) terminal due to electromigration (EM) considerations, since a single minimum size die pad may fail the EM rule for high current terminals in some circuit designs. There is thus a bottleneck that limits the reduction of flip chip die size because of the solder pad design constraint.

SUMMARY

Disclosed embodiments recognize a large solder bump size alone does not solve the electromigration (EM) problem for high current pins, such as power supply pins, without a enlarged die pad under the under bump metal UBM pad and a larger area via between the die pad and the UBM pad. As disclosed herein, the semiconductor die size can be reduced while enabling reliable device performance and a reduction in die size by combining multiple small die pads that were necessary to divide the current flowing to or from a single metal line for EM considerations for conventional circuit designs into a larger die pad, while other die pads (such as connected to signal nodes/pins) on the semiconductor die are kept smaller. Enlarged area die pads, vias and UBM pads are used for larger solder bumps, while smaller area die pads, vias and UBM pads can be used for the smaller solder bumps.

Disclosed embodiments include semiconductor die and electronic assemblies therefrom, where the die include a first contact stack including a first die pad having a first pad perimeter, a first via through a dielectric layer to the first die pad having a first via perimeter, and a first UBM pad contacting the first die pad through the first via having a first UBM pad perimeter. A second contact stack includes a second die pad having a second pad perimeter shorter than the first pad perimeter, a second via through the dielectric layer to the second die pad having a second via perimeter shorter than the first via perimeter, and a second UBM pad contacting the second die pad through the second via having a second via perimeter shorter than the first via perimeter. A third contact stack includes a third die pad having a third pad perimeter, a third via through the dielectric layer to the third die pad, and a third UBM pad contacting the third die pad through the third via having a third UBM pad perimeter that is longer than the second UBM pad perimeter. A first solder bump is on the first UBM pad, a second solder bump on the second UBM pad, and a third solder bump on the third UBM pad. The first solder bump, second solder bump and third solder bump all have different sizes.

BRIEF DESCRIPTION OF THE DRAWINGS

FIG. 1A is a cross sectional depiction of an example semiconductor die having an improved contact structure that is configured for flip chip assembly, according to an example embodiment.

FIG. 1B is a cross sectional depiction of an example semiconductor die having an improved contact structure that is configured for flip chip assembly, according to another example embodiment.

DETAILED DESCRIPTION

Figure 1C:
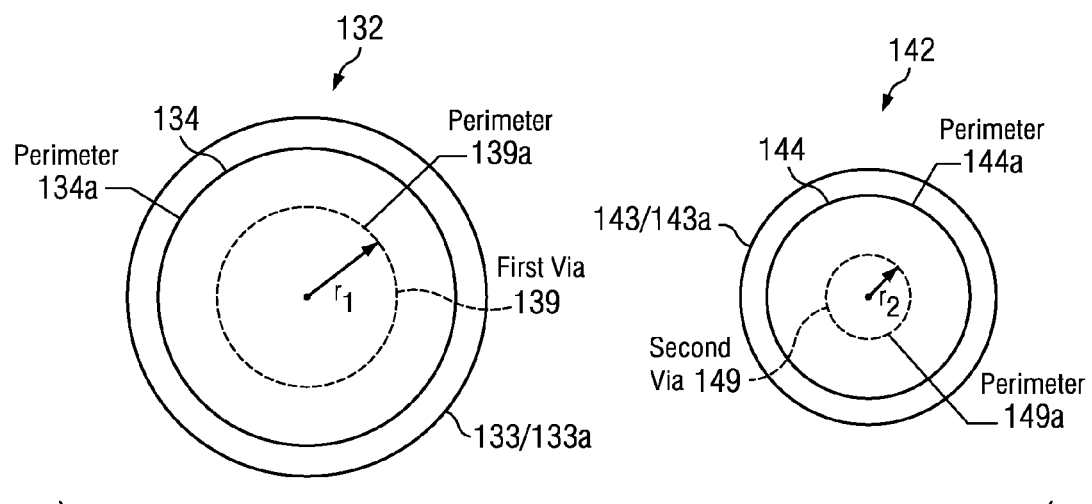
FIG. 1C is a top view depiction of the semiconductor die shown in FIG. 1A with the respective solder bumps removed to reveal the features of the respective contact stacks.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a cross sectional depiction of an example semiconductor die 100 having an improved contact structure configured for flip chip assembly, according to an example embodiment. Semiconductor die 100 includes solder bumps having both smaller size second solder bumps (e.g., smaller bump diameters) 141 and larger size first solder bumps 131 (e.g., larger bump diameters and thus larger solder volumes). All solder bumps have essentially the same bump height when measured from the topside surface 106 of the semiconductor die 100. For convenience, the larger/enlarged area contact stacks are referred herein to as first contact stacks that include larger area (and thus larger perimeter) die pads, larger vias and larger UBM pads that include larger solder bumps that can be used for power supply connections, while smaller area (and thus smaller perimeter) contact stacks are referred to herein as second contact stacks include smaller area die pads, smaller area vias and smaller UBM pads that can be used for the smaller solder bumps that can be used for typical signal node connections.

Semiconductor die 100 is adapted for assembly to a substrate/workpiece that has a single bonding level (e.g., single metal-level (ML) substrate having a single plane of metal (e.g., copper) land pads), such as the substrate 230 shown in FIG. 2A described below. FIG. 1C is a top view depiction of the semiconductor die shown in FIG. 1A with the respective solder bumps 131 and 141 removed to reveal the features of the respective contact stacks 132 and 142.

Semiconductor die 100 comprises a substrate 105 having a topside surface 106. The topside surface 106 includes circuit elements comprising active circuitry shown with active circuitry blocks 109a and 109b identified therein. The circuit elements on the topside surface 106 of semiconductor die 100 are configured to provide an IC function. Example circuit functions include those to implement digital signal processors (DSP's), data converters, and integrated power semiconductor devices such as power regulators, amplifiers and preamplifiers, and functions to support other IC applications. The substrate 105 can comprise a variety of different substrate materials, such as silicon, and silicon-germanium, for example.

Semiconductor die 100 includes a back end of the line (BEOL) ML metal stack 120 on the topside surface 106 comprising M1 (first level metal) and Mn (top level metal) having inter-level dielectric layers 117 between the respective metal layers. Although not referenced specifically in FIGS. 1A and 1B, there can be seen to be plurality of intermediate metal layers, such as M2, M3, and M4, . . . having inter-level dielectric layers 117 between the respective metal layers. A passivation layer 148 comprising a dielectric material is over the ML metal stack 120. Mn provides a plurality of die pads including the first die pad 133 and second die pad 143 shown. Mn can comprise metal including copper or aluminum, such as an aluminum copper alloy. Although the respective metal layers M1 to Mn are all generally approximately the same thickness, the intermediate metal levels between M1 to Mn in FIGS. 1A, 1B, 2A and 2B are all shown thinned considerably to compress the size of these figures.

The passivation layer 148 has vias (see vias 139 and 149 in FIG. 1C, described below) that expose first die pad 133 and second die pad 143 to allow direct coupling thereto by first and second UBM pads 134 and 144, respectively. There is no redistribution layer (RDL) between the UBM pads 134, 144 and the die pads 133, 143.

Semiconductor die 100 is shown including a first flip chip bonding feature 130 comprising a first solder bump 131 on a first contact stack 132, and a second flip chip bonding feature 140 comprising a second solder bump 141 on a second contact stack 142. A node/pin within active circuitry 109a is shown coupled to first die pad 133, and a node/pin within active circuitry 109b is shown coupled to second die pad 143. The node within active circuitry 109a can be a high current node such as a power supply (e.g., VCC/VEE) node or high current signal nodes, while the node within active circuitry 109b shown coupled to second die pad 143 can be a lower current node, such as a typical signal node. One particular example of a high current node signal node (as opposed to a power supply node) comprises writer pins on preamplifier ICs for hard disk drive (HDD) applications.

The first contact stack 132 includes a first die pad 133 having a first pad perimeter length (see perimeter 133a shown in FIG. 1C). A first via 139 is through the passivation layer 148 to the first die pad 133 that has a first via perimeter (see via perimeter 139a shown in FIG. 1C). Passivation layer 148 can comprise various dielectrics, such as a polyimide, benzocyclobutene (BCB) or silicon nitride.

A first UBM pad 134 directly contacts the first die pad 133 through first via 139 in the passivation layer 148 having a first UBM pad perimeter length 134a. Disclosed UBM pads such as first UBM pad 134 can comprise one or more layers as known in the art. The second contact stack 142 includes a second die pad 143 having a second pad perimeter 143a that is shorter than the first pad perimeter 133a, and a second via 149 through passivation layer 148 to the second die pad 143 having a second via perimeter 149a that is shorter than the first via perimeter 139a. The second UBM pad 144 directly contacts the second die pad 143 through the second via 149.

Semiconductor die 100 is seen to feature enlarged respective areas and perimeters for the components of the first contact stack 132 as compared to the respective areas and perimeters for the components of the second contact stack 142. Specifically, semiconductor die 100 provides the first contact stack 132 comprising an enlarged first die pad 133 under an enlarged first UBM pad 134, and an enlarged via between the first die pad 133 and the first UBM pad 134, as compared to the respective sizes of the second contact stack 142 comprising second die pad 143 under the second UBM pad 144, and the second via 149 between the second die pad 143 and the second UBM pad 144.

Semiconductor die 100 is also configured to pass a third current through the combination of the third die pad 183, third via and the third UBM pad 184 with a third current density that is below the predetermined threshold current density per perimeter length (e.g., based on industry standard value based on the respective material compositions) at the third pad perimeter, at the third via perimeter, and at the third UBM pad perimeter, that if passed through the combination of the second die pad 143, the second via 149, and the second UBM pad 144 the first current and the third current would have exceeded the predetermined threshold current density per perimeter length at the second pad perimeter 143a, the second via perimeter 149a, and at the second UBM pad perimeter 144a.

FIG. 1B is a cross sectional depiction of an example semiconductor die 150 having an improved contact structure configured for flip chip assembly, according to another example embodiment. Semiconductor die 150 includes solder bumps having the second contact stack 142 shown in FIG. 1A including the smaller size second solder bumps 141, and a first contact structure 180 including larger size third solder bumps 181, where the larger size third solder bump 181 shown has a taller bump height as compared to the second solder bump 141 when measured from the topside surface of the semiconductor die 100, as well a larger diameter. This embodiment is adapted for assembly to a substrate/workpiece that has multiple bonding levels (e.g. a 2 ML substrate that has a first and a second plane of metal (e.g., copper) land pads, such as shown in FIG. 2B).

Third contact stack 182 is shown including a third die pad 183 having a first pad perimeter length, with a via (analogous to first via 139 shown in FIG. 1C) through the passivation layer 148 to the third die pad 183 that has a first via perimeter length. A third UBM pad 184 directly contacts the third die pad 183 through a via (analogous to the first via 139 shown in FIG. 1C) in the passivation layer 148.

FIG. 1C is a top view depiction of semiconductor die 100 with the respective solder bumps 131 and 141 removed to reveal the features of the first contact stack 132 and the second contact stack 142. The first contact stack 132 is seen to include a first via 139 that provides an aperture through passivation layer 148 that allows first UBM pad 134 to directly contact the first die pad 133, while second contact stack 142 is seen to include a second via 149 that provides an aperture through passivation layer 148 that allows second UBM pad 144 to directly contact the second die pad 143. First die pad 133 has a first pad perimeter length 133a, and the second die pad 143 has a second pad perimeter length 143a.

The first via 139 has a first via perimeter length 139a that can be approximated as $2\pi r_1$ when the first via 139 is circular or nearly circular (e.g., octagon shaped), while the second via 149 has a second via perimeter length 149a that is equal to $2\pi r_2$ when second via is also circular or nearly circular. As shown, $r_1 \gg r_2$. Although the die pads 133 and 143, vias 139 and 149, and first and second UBM pads 134 and 144 are all shown as being circular in shape, the shapes for these features for disclosed embodiments can include a variety of other shapes, such as rectangular and octagon. The first contact stack 132 thus provides an enhanced area pad area (pad perimeter) not only on the UBM level, but also the die pad level that provides die pad 133 under the first UBM pad 134 and the first via 139. The solder bump height for the solder bumps 131 and 141 can be calculated with the assumption that post reflow the solder bump is approximately a portion of a sphere. Accordingly, based on the solder bump height and the perimeter length required per design, the solder volume can be calculated. The difference between the first via perimeter 139a and the first pad perimeter length 133a can be equal to the difference between the second via perimeter 149a and the second pad perimeter 143a based on the formula $\Delta d = 2\pi \Delta r$, where d is the perimeter of a circle and r is the radius, and the via and the pad are circular or an octagon approaching a circle.

Figure 1D:
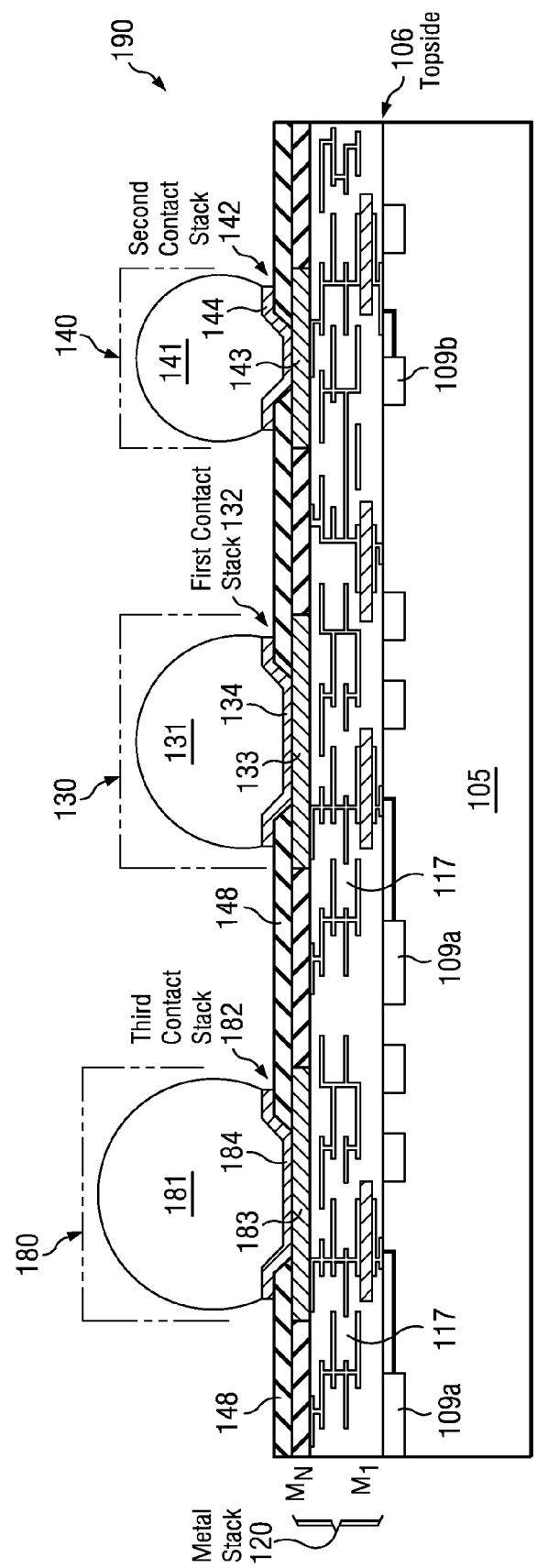
FIG. 1D is a cross sectional depiction of an example semiconductor die having an improved contact structure that is configured for flip chip assembly, according to yet another example embodiment.

FIG. 1D is a cross sectional depiction of an example semiconductor die 190 having an improved contact structure that is configured for flip chip assembly, according to yet another example embodiment. Semiconductor die 190 includes three (3) different solder ball sizes including the first solder bump 131 on the first contact stack 132 shown in FIG. 1A, the second solder bump 141 on the second contact stack 132 shown in FIGS. 1A and 1B, and the third solder bump 181 on the third contact stack 182 shown in FIG. 1B. Third solder bump 181 provides a larger bump diameter and a larger bump height as compared to the bump diameter and bump height of the second solder bump 141, while the first solder bump 131 has a larger bump diameter and the bump height of the second solder bump 141. Although not shown, semiconductor die 190 may also include a fourth solder bump having the larger bump height of the third solder bump 181, with the bump diameter of the second solder bump 141. Moreover, the diameter of third solder bump 181, second solder bump 141, and first solder bump 131 can be all be different, and/or the heights of third solder bump 181, second solder bump 141, first solder bump 131 can all also be different.

Figure 2A:
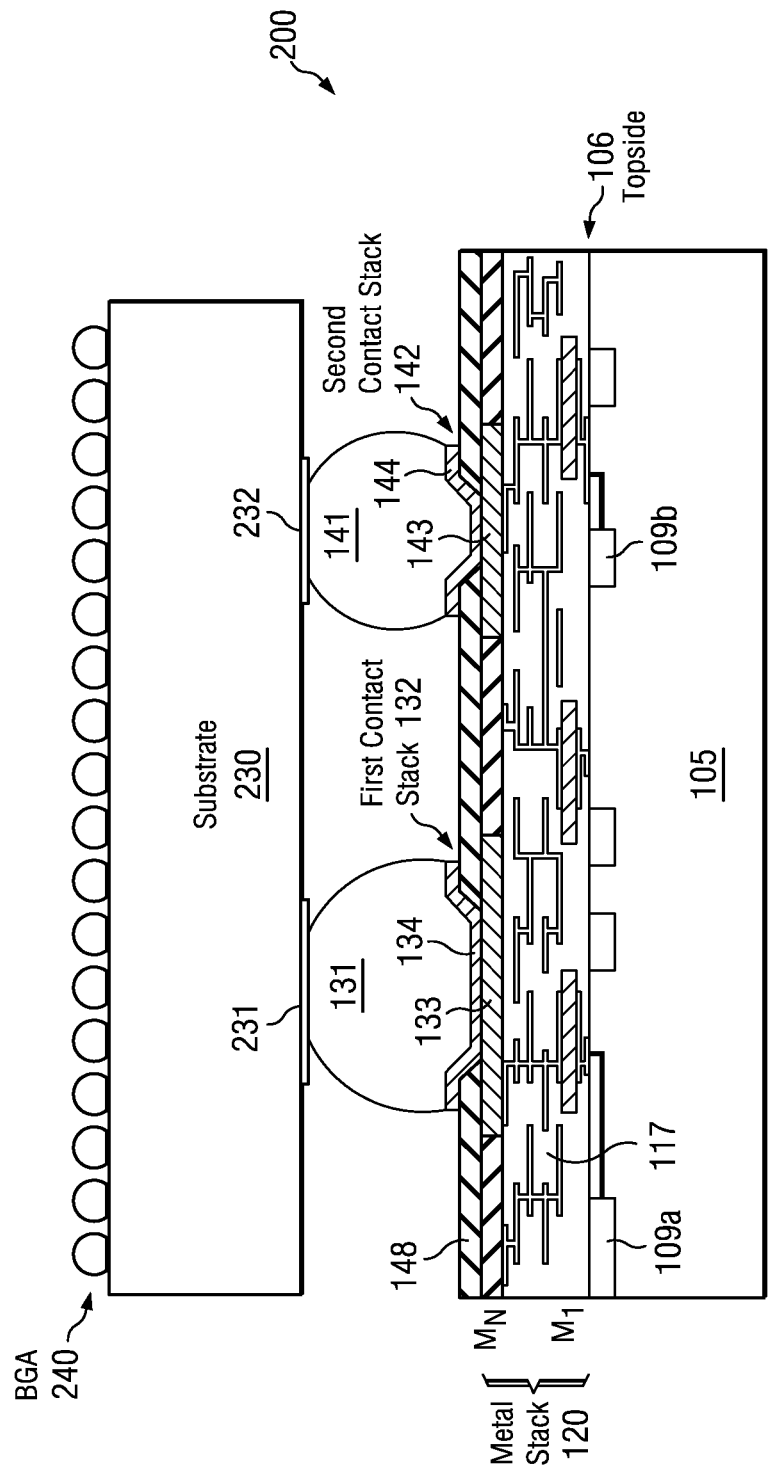
FIG. 2A is a cross sectional depiction of an electronic assembly including the semiconductor die shown in FIG. 1A bonded to a workpiece having a single level of land pads.
Figure 2B:
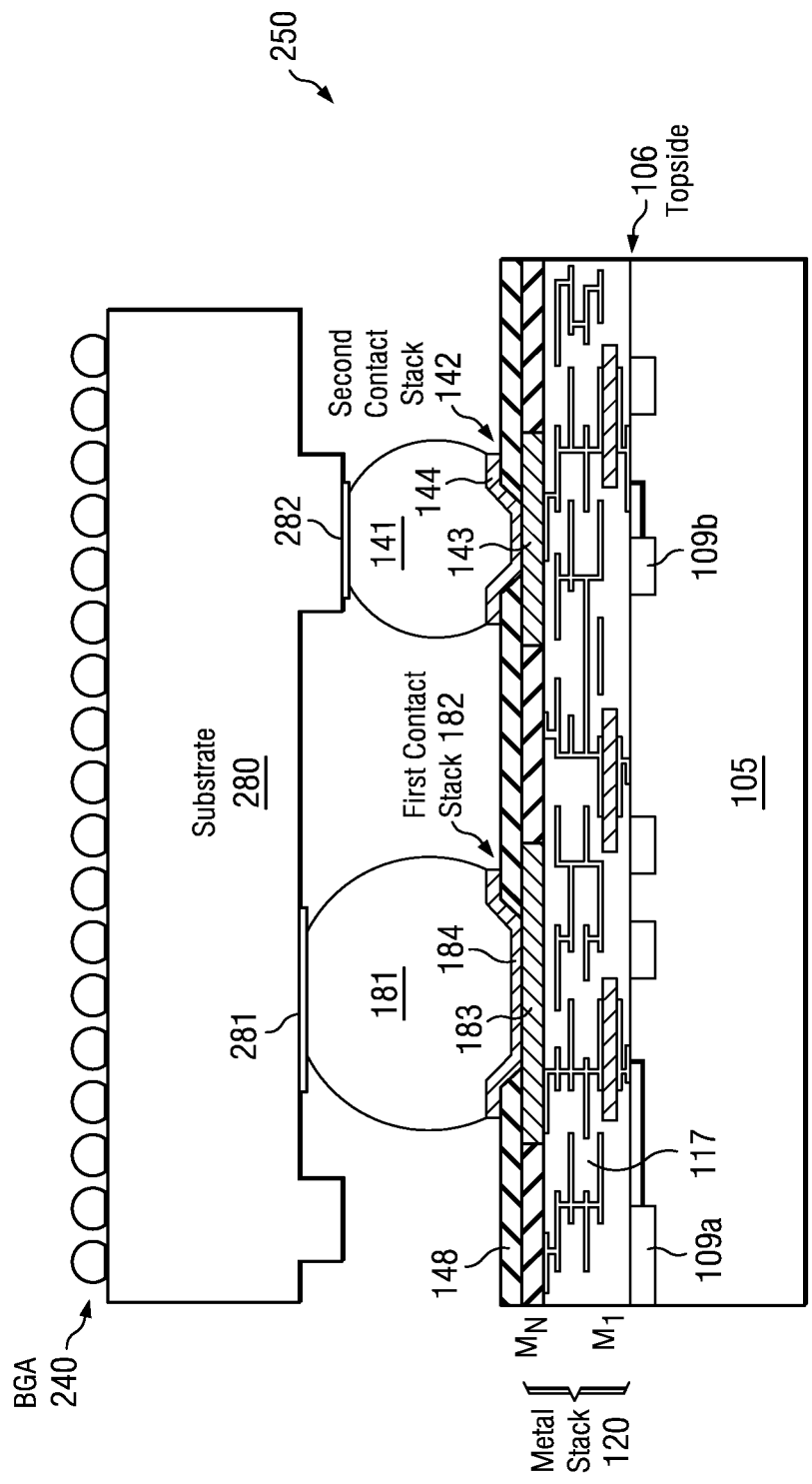
FIG. 2B is a cross sectional depiction of an electronic assembly including the semiconductor die shown in FIG. 1B bonded to a workpiece having a first level and a second level of land pads.
Figure 2C:
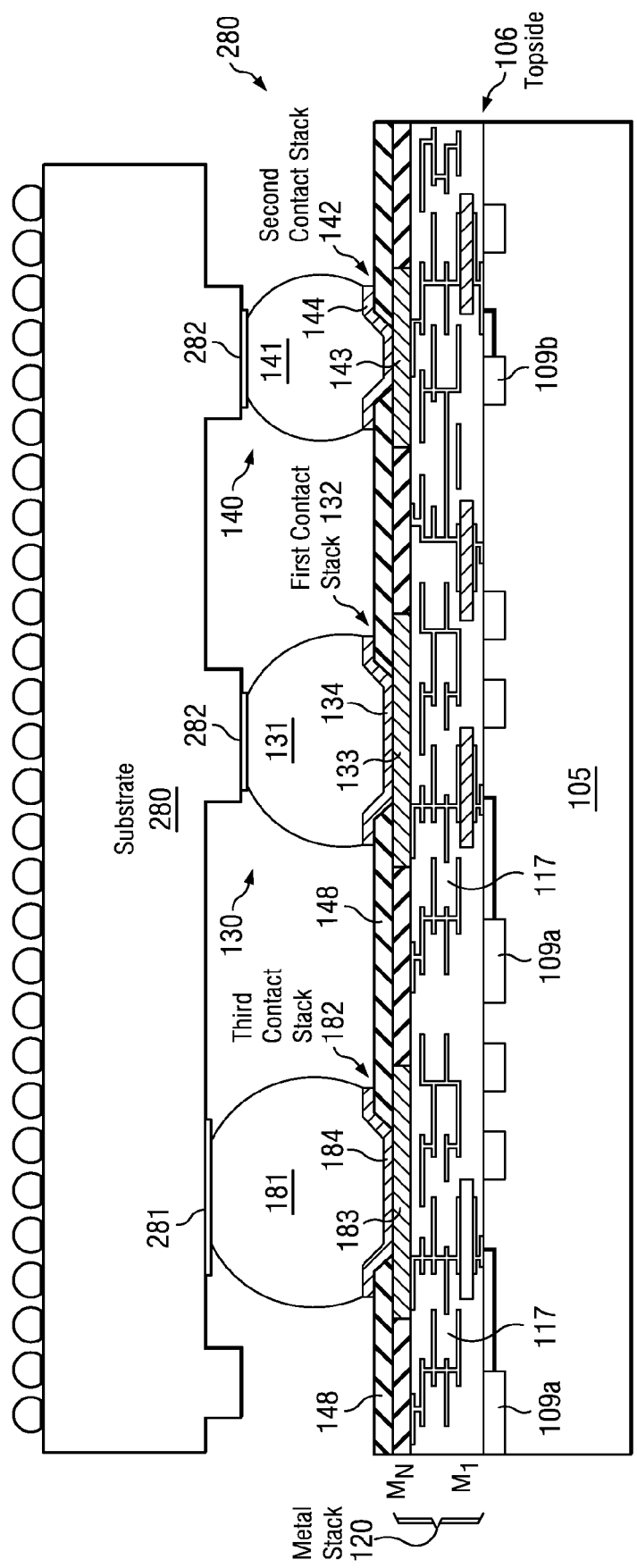
FIG. 2C is a cross sectional depiction of an electronic assembly including the semiconductor die shown in FIG. 1D bonded to a workpiece having a first level and a second level of land pads.

FIG. 2A is a cross sectional depiction of an electronic assembly 200 including the semiconductor die 100 shown in FIG. 1A bonded to a workpiece shown as substrate 230 that has a single level of land pads, including the land pads 231 and 232 shown. Substrate 230 being a single M1 substrate is generally a low cost substrate, such as a printed circuit cable (e.g., flexible printed cable). Substrate 230 can comprise a variety of other flexible substrates, for example in one particular embodiment a copper/polyimide flex substrate. As known in the art, flexible substrates allow non-destructive folding or bending to fit the available space or to allow relative movement.

The solder bumps 131 and 141 have the same height when measured from the topside surface 106 of the semiconductor die, with solder bump 131 having a larger diameter and thus a larger solder volume as compared to second solder bump 141, such as in one embodiment 1.6 to 3.5 times bigger. Substrate 230 is also shown having a ball grid array (BGA 240) comprising a plurality of solder bumps. Disclosed substrates can also comprise flexible cable, printed circuit board (PCB), or a PCB having a BGA.

FIG. 2B is a cross sectional depiction of an electronic assembly 250 including the semiconductor die 150 shown in FIG. 1B bonded to a workpiece shown as substrate 280 having a first ML and a second ML of land pads, including a first land pad 282 on the first ML and a second land pad 281 on the second ML. The taller third solder bump 181 has the proper height to properly reach to couple to the second land pad 281 on the second ML, while the shorter second solder bump 141 is shown having the proper height to couple to first land pad 282 on the first ML. Although not shown, substrate 280 can include more than 2 MLs.

Figure 3:
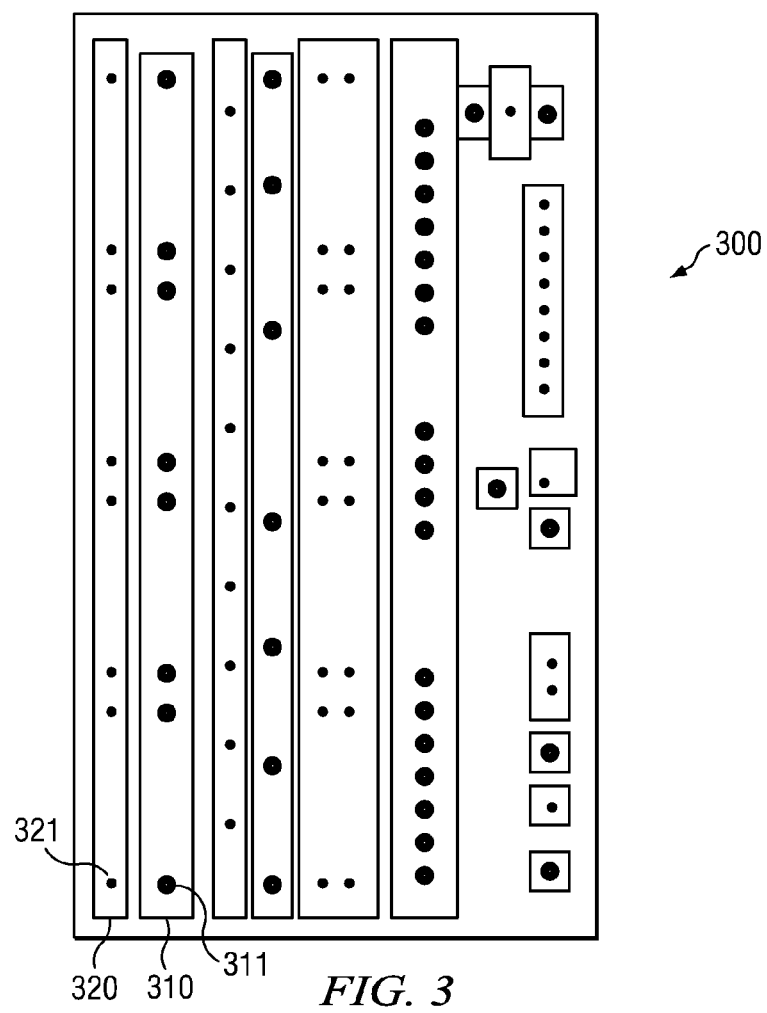
FIG. 3 is a depiction of an example bonding feature layout for a semiconductor die including regions having enlarged bonding feature dimensions including enlarged solder bumps, and smaller dimension bonding features including smaller size solder bumps, according to an example embodiment.

FIG. 3 is a depiction of an example bonding feature layout 300 for a semiconductor die including regions 310 having enlarged bonding features including enlarged solder bumps 311, and regions 320 having smaller bonding features including smaller size solder bumps 321, according to an example embodiment. As described above, disclosed larger size contact stacks including enlarged size solder bumps 311 can be used for power supply connections (e.g., VCC/VEE) and high current signal nodes to meet the EM requirement with less solder bumps, with the disclosed smaller size solder bumps 321 used for lower current handling signal connections, such as signal nodes. Layouts such as layout 300 effectively combines multiple small die pads that were necessary in conventional layouts to divide the current flowing to or from a single metal line for EM considerations into a larger pad, while other die pads (such as connected to signal nodes) on the semiconductor die are kept smaller, which can reduce the die size up to 40% in one embodiment.

It may also be important to consider die warpage/tilting during backend assembly and flip chip die reflow to a substrate, such as substrate 280. Disclosed enlarged bonding features including enlarged solder bumps 311 can also be applied for connections to some relatively low current nodes on the die to reduce die warpage/tilting, such as by placement of enlarged contact stacks including enlarged solder bumps 311 thereon (larger bump height and larger bump diameter) to provide a distribution of enlarged solder bumps that are spread substantially symmetrically within the semiconductor die. For example, it can be seen in layout 300 that there is at least one enlarged solder bump 311 corresponding to all four quadrants of the semiconductor die, where as described above the enlarged solder bumps 311 are on a disclosed first contact stack 132 (see FIG. 1A) or third contact stack 182 (see FIG. 1B).

Disclosed embodiments provide several benefits. As disclosed above, the die size can be reduced while enabling reliable device performance and a reduction of die size (e.g., up to 40%) by combining multiple small die pads that were necessary to divide the current flowing to or from a single metal line for EM considerations into a larger pad, while other die pads (such as connected to signal nodes) on the semiconductor die are kept smaller. Embodiments such as semiconductor die 150 and semiconductor die 190 having dual bump height/diameter are configured for assembly to substrates having solder bumps that reside on 2 different planes of metal, such as a dual ML substrate having copper land pads on each of the MLs. Embodiments such as semiconductor die 100 having the same bump height with different bump diameters are configured for assembly to low cost single ML layer substrates.

Disclosed embodiments can be integrated into a variety of assembly flows to form a variety of different semiconductor IC devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

I claim:

1. A semiconductor die, comprising:
    a first contact stack, including:
        first die pad having a first pad perimeter,
        a first via through a dielectric layer to said first die pad having a first via perimeter, and
        a first under bump metal (UBM) pad contacting said first die pad through said first via having a first UBM pad perimeter;
    a second contact stack, including:
        a second die pad having a second pad perimeter shorter than said first pad perimeter,
        a second via through said dielectric layer to said second die pad having a second via perimeter shorter than said first via perimeter, and
        a second UBM pad contacting said second die pad through said second via having a second UBM pad perimeter that is shorter than said first UBM pad perimeter;
    a third contact stack, including:
        a third die pad having a third pad perimeter,
        a third via through said dielectric layer to said third die pad, and
        a third UBM pad contacting said third die pad through said third via having a third UBM pad perimeter that is longer than said second UBM pad perimeter; and
    a first solder bump on said first UBM pad, a second solder bump on said second UBM pad, and a third solder bump on said third UBM pad, wherein said first solder bump, said second solder bump and said third solder bump all have different sizes,
    wherein said semiconductor die is configured to pass a first current through a combination of said first die pad, said first via and said first UBM with a first current density below a predetermined threshold current density per perimeter length at said first pad perimeter, at said first via perimeter and at said first UBM pad perimeter, and a third current through a combination of said third die pad, said third via and said third UBM with a third current density below said predetermined threshold current density per perimeter length, at said third via perimeter and at said third UBM pad perimeter, wherein when said first current or said third current is passed through a combination of said second die pad, said second via and said second UBM said first current and said third current would have exceeded said predetermined threshold current density per perimeter length at said second pad perimeter, at said second via perimeter, and at said second UBM pad perimeter.

2. The semiconductor die of claim 1, wherein said third solder bump has a larger bump diameter and a larger bump height as compared to a bump diameter and a bump height of said second solder bump, and wherein said first solder bump has a larger bump diameter and said bump height of said second solder bump.

3. The semiconductor die of claim 1, wherein a power supply pin on said semiconductor die is coupled to said first contact stack and said third contact stack, and wherein a signal pin on said semiconductor die is coupled to said second contact stack.

4. The semiconductor die of claim 1, wherein said semiconductor die comprises an integrated power semiconductor device.

5. An electronic assembly, comprising:
    a semiconductor die, comprising:
        a first contact stack, including:
            first die pad having a first pad perimeter,
            a first via through a dielectric layer to said first die pad having a first via perimeter, and
            a first under bump metal (UBM) pad contacting said first die pad through said first via having a first UBM pad perimeter, and
        a second contact stack, including:
            a second die pad having a second pad perimeter shorter than said first pad perimeter,
            a second via through said dielectric layer to said second die pad having a second via perimeter shorter than said first via perimeter; and
            a second UBM pad contacting said second die pad through said second via having a second UBM pad perimeter that is shorter than said first UBM pad perimeter;
        a third contact stack, including:
            a third die pad having a third pad perimeter,
            a third via through said dielectric layer to said third die pad, and
            a third UBM pad contacting said third die pad through said third via having a third UBM pad perimeter that is longer than said second UBM pad perimeter;
    a substrate having at least a first metal level (ML) including a first land pad and a third land pad and second ML having a second land pad; and
    a first solder bump on said first UBM pad coupled to a first land pad, a second solder bump on said second UBM pad coupled to said second land pad, and a third solder bump on said third UBM pad coupled to a third land pad, wherein said first solder bump, said second solder bump, and said third solder bump all have different sizes, wherein said first solder bump has a larger bump diameter and a larger bump height as compared to a bump diameter and a bump height of said second solder bump, and wherein said third solder bump has said larger bump diameter and said bump height of said second solder bump, and wherein said semiconductor die is configured to pass a first current through a combination of said first die pad, said first via and said first UBM with a current density below a predetermined threshold current density per perimeter length at said first pad perimeter, at said first via perimeter and at said first UBM pad perimeter, and a third current through a combination of said third die pad, said third via and said third UBM with a third current density below said predetermined threshold current density per perimeter length, at said third via perimeter and at said third UBM pad perimeter, wherein when said first current or said third current is passed through a combination of said second die pad, said second via and said second UBM said first current and said third current would have exceeded said predetermined threshold current density per perimeter length at said second pad perimeter, at said second via perimeter, and at said second UBM pad perimeter.

6. The electronic assembly of claim 5, wherein a power supply pin on said semiconductor die is coupled by said first solder bump to said first land pad and by said third solder bump to said third land pad, and wherein a signal pin on said semiconductor die is coupled by said second solder bump to said second land pad.

7. The electronic assembly of claim 5, wherein said substrate comprises a flexible substrate, a printed circuit board (PCB), or a PCB having a ball grid array (BGA).

8. The electronic assembly of claim 5, wherein said semiconductor die comprises an integrated power semiconductor device.

9. The electronic assembly of claim 5, wherein there is at least one of said first solder bump or said third solder bump corresponding to all four quadrants of said semiconductor die.

* * * * *